(12) United States Patent
Kagawa (10) Patent No.: US 10,538,054 B2
(45) Date of Patent: Jan. 21, 2020

(54) HEAT-DISSIPATING FILM, AND ITS PRODUCTION METHOD AND APPARATUS

(71) Applicant: Seiji Kagawa, Koshigaya (JP)

(72) Inventor: Seiji Kagawa, Koshigaya (JP)

( * ) Notice: Subject to any disclaimer, the term of this patent is extended or adjusted under 35 U.S.C. 154(b) by 0 days.

(21) Appl. No.: 16/125,364

(22) Filed: Sep. 7, 2018

(65) Prior Publication Data
US 2019/0001616 A1     Jan. 3, 2019

Related U.S. Application Data

(62) Division of application No. 14/911,486, filed as application No. PCT/JP2014/071241 on Aug. 11, 2014, now abandoned.

(30) Foreign Application Priority Data

Aug. 12, 2013  (JP) ................................. 2013-167925

(51) Int. Cl.
  *B32B 5/16*      (2006.01)
  *C01B 32/05*     (2017.01)
  (Continued)

(52) U.S. Cl.
  CPC ................. *B32B 5/16* (2013.01); *B29D 7/01* (2013.01); *B32B 3/04* (2013.01); *B32B 5/30* (2013.01);
  (Continued)

(58) Field of Classification Search
  CPC combination set(s) only.
  See application file for complete search history.

(56) References Cited

U.S. PATENT DOCUMENTS 5,863,467 A    1/1999  Mariner et al.
8,758,656 B2   6/2014  Nishikawa et al.
(Continued)

FOREIGN PATENT DOCUMENTS

EP    0805463 A1    11/1997
JP    3-205900 A     9/1991
(Continued)

OTHER PUBLICATIONS

Extended European Search Report issued in European Application No. 14836673.5 dated Mar. 16, 2017.
(Continued)

*Primary Examiner* — Sing P Chan
(74) *Attorney, Agent, or Firm* — Birch, Stewart, Kolasch & Birch, LLP (57) ABSTRACT

A heat-dissipating film comprising a heat-conductive layer obtained by burning a mixture layer of flaky carbon and a binder resin to carbonize or burn off the binder resin, and plastic films covering the heat-conductive layer, the heat-conductive layer having a density of 1.9 g/cm$^3$ or more and thermal conductivity of 450 W/mK or more, is produced by (1) sandwiching a mixture layer of flaky carbon and a binder resin with a pair of first plastic films to form a laminated film; (2) heat-pressing the laminated film to densify the mixture layer; (3) burning the mixture layer to carbonize the binder resin in the mixture layer; (4) pressing the resultant burnt layer to form the heat-conductive layer; and (5) sealing the heat-conductive layer with second plastic films.

15 Claims, 10 Drawing Sheets

(51) Int. Cl.
  *B32B 27/28* (2006.01)
  *B32B 9/00* (2006.01)
  *B29D 7/01* (2006.01)
  *B32B 27/06* (2006.01)
  *B32B 9/04* (2006.01)
  *B32B 5/30* (2006.01)
  *B32B 27/30* (2006.01)
  *B32B 27/36* (2006.01)
  *C09K 5/14* (2006.01)
  *B32B 3/04* (2006.01)
  *B32B 27/34* (2006.01)
  *B32B 27/32* (2006.01)
  *B32B 27/14* (2006.01)
  *H01L 23/373* (2006.01)
  *B32B 27/18* (2006.01)
  *B32B 27/24* (2006.01)
  *B32B 38/10* (2006.01)
  *B32B 37/22* (2006.01)
  *B32B 37/02* (2006.01)
  *B32B 37/10* (2006.01)
  *B32B 37/06* (2006.01)
  *B32B 37/24* (2006.01)

(52) U.S. Cl.
  CPC ............. *B32B 9/007* (2013.01); *B32B 9/045* (2013.01); *B32B 9/048* (2013.01); *B32B 27/06* (2013.01); *B32B 27/14* (2013.01); *B32B 27/18* (2013.01); *B32B 27/281* (2013.01); *B32B 27/285* (2013.01); *B32B 27/286* (2013.01); *B32B 27/288* (2013.01); *B32B 27/302* (2013.01); *B32B 27/304* (2013.01); *B32B 27/306* (2013.01); *B32B 27/308* (2013.01); *B32B 27/32* (2013.01); *B32B 27/34* (2013.01); *B32B 27/36* (2013.01); *B32B 27/365* (2013.01); *C01B 32/05* (2017.08); *C09K 5/14* (2013.01); *H01L 23/3737* (2013.01); *B32B 37/02* (2013.01); *B32B 37/06* (2013.01); *B32B 37/10* (2013.01); *B32B 37/22* (2013.01); *B32B 38/10* (2013.01); *B32B 2037/243* (2013.01); *B32B 2250/40* (2013.01); *B32B 2260/025* (2013.01); *B32B 2260/046* (2013.01); *B32B 2264/00* (2013.01); *B32B 2264/108* (2013.01); *B32B 2307/30* (2013.01); *B32B 2307/302* (2013.01); *B32B 2307/416* (2013.01); *B32B 2307/72* (2013.01); *B32B 2309/02* (2013.01); *B32B 2457/00* (2013.01); *H01L 2924/0002* (2013.01)

(56) References Cited

U.S. PATENT DOCUMENTS

| | | | |
|---|---|---|---|
| 8,956,496 B2* | 2/2015 | Biegler | B32B 37/04 156/309.9 |
| 8,987,630 B2* | 3/2015 | Hengel | B23K 11/06 219/81 |
| 9,363,932 B2 | 6/2016 | Wang et al. | |
| 10,226,897 B2* | 3/2019 | Biegler | B32B 37/04 |
| 2007/0084154 A1* | 4/2007 | Kissling | B65B 9/023 53/551 |
| 2010/0073882 A1 | 3/2010 | Yoshikawa et al. | |
| 2011/0147475 A1* | 6/2011 | Biegler | B29C 65/103 239/1 |
| 2011/0151171 A1* | 6/2011 | Biegler | B32B 3/06 428/57 |
| 2012/0318454 A1* | 12/2012 | Biegler | B32B 37/04 156/308.6 |
| 2013/0120959 A1 | 5/2013 | Wano et al. | |
| 2014/0209168 A1 | 7/2014 | Zhamu et al. | |
| 2014/0293626 A1 | 10/2014 | Yoshikawa et al. | |
| 2015/0259546 A1 | 9/2015 | Kagawa | |
| 2016/0093908 A1* | 3/2016 | Kitoh | H01M 8/1069 156/243 |
| 2016/0185074 A1* | 6/2016 | Kagawa | H01L 23/3737 428/341 |
| 2016/0243764 A1* | 8/2016 | Hays | B33Y 80/00 |
| 2018/0257265 A1* | 9/2018 | Mizutori | B29C 70/504 |
| 2019/0001616 A1* | 1/2019 | Kagawa | H01L 23/3737 |

FOREIGN PATENT DOCUMENTS

| | | |
|---|---|---|
| JP | 11-1621 A | 1/1999 |
| JP | 2002-273333 A | 9/2002 |
| JP | 2006-86271 A | 3/2006 |
| JP | 2006-306068 A | 11/2006 |
| JP | 2008-311610 A | 12/2008 |
| JP | 2012-211259 A | 11/2012 |
| JP | 2579699 A1 | 4/2013 |
| JP | 2014-127518 A | 7/2014 |
| JP | 2925108 A1 | 9/2015 |

OTHER PUBLICATIONS

International Search Report (PCT/ISA/210) issued in PCT/JP2014/071241, dated Oct. 21, 2014.
Written Opinion (PCT/ISA/237) issued in PCT/JP2014/071241, dated Oct. 21, 2014.

* cited by examiner

Fig. 19

HEAT-DISSIPATING FILM, AND ITS PRODUCTION METHOD AND APPARATUS

CROSS-REFERENCE TO RELATED APPLICATIONS

This application is a Divisional of co-pending application Ser. No. 14/911,486 filed on Feb. 11, 2016, which is a National Phase of PCT International Application No. PCT/JP2014/071241 filed on Aug. 11, 2014, which claims priority under 35 U.S.C. § 119(a) to Patent Application No. 2013-167925 filed in Japan on Aug. 12, 2013. All of the above applications are hereby expressly incorporated by reference into the present application.

FIELD OF THE INVENTION

The present invention relates to a heat-dissipating film for efficiently dissipating heat generated from electronic devices, etc. in small electronic appliances such as note-type personal computers, smartphones, mobile phones, etc., and its production method and apparatus.

BACKGROUND OF THE INVENTION

In small electronic appliances such as note-type personal computers, smal (phones, mobile phones, etc., which have been provided with increasingly higher performance and more functions, electronic devices such as microprocessors, imaging chips, memories, etc. should be mounted densely. Accordingly, to prevent malfunction due to heat, the dissipation of heat generated from such electronic devices has become increasingly important.

As a heat-dissipating sheet composed of flaky carbon such as graphite for electronic devices, a graphite sheet obtained by heat-treating polyimide at 3000° C. in an oxygen-free atmosphere to remove hydrogen, oxygen and nitrogen, and annealing the remaining carbon for crystallization, is used. The graphite sheet has as high thermal conductivity as 800 W/mK in an in-plane direction and 15 W/mK in a thickness direction. However, because expensive polyimide is heat-treated at a high temperature, the graphite sheet is extremely expensive.

As an inexpensive heat-dissipating sheet of flaky carbon, JP 2006-306068 A discloses a heat-conductive sheet comprising at least a graphite film and an adhesive resin composition, which is a reaction-curable vinyl polymer. This graphite film is (a) expanded graphite formed by an expanding method, or (b) obtained by heat-treating a polyimide film, etc., at a temperature of 2400° C. or higher. The expanded graphite film is obtained by immersing graphite in acid such as sulfuric acid, etc. to form a graphite interlayer compound, heat-treating the graphite interlayer compound to foam it, thereby separating graphite layers, washing the resultant graphite powder to remove acid, and rolling the resultant thin-film graphite powder. However, the expanded graphite film has insufficient strength. Also, the graphite film obtained by the heat treatment of a polyimide film, etc. is disadvantageously expensive despite high heat dissipation.

JP 2012-211259 A discloses a heat-conductive sheet comprising graphite pieces, which comprise pluralities of first graphite pieces obtained by thinly cutting a thermally decomposed graphite sheet, and second graphite pieces smaller than the widths of the first graphite pieces, at least the first graphite pieces connecting both surfaces of the heat-conductive sheet. This heat-conductive sheet is obtained, for example, by blending the first and second graphite pieces with a mixture of an acrylic polymer and a solvent, and extruding the resultant blend. However, the extruded heat-conductive sheet does not have sufficient heat dissipation, because of a high volume fraction of the resin.

JP 2006-86271 A discloses a heat-dissipating sheet as thick as 50-150 μm comprising graphite bonded by a binder resin having a glass transition temperature of −50° C. to +50° C., such as an amorphous saturated copolyester, a mass ratio of graphite/binder resin being 66.7/33.3 to 95/5. This heat-dissipating sheet is produced by applying a slurry of graphite and a binder resin in an organic solvent to a parting-agent-coated film on the side of a parting layer, drying the slurry by hot air to remove the organic solvent, and then pressing it, for example, at 30 kg/cm$^2$. JP 2006-86271 A describes that the pressing of a graphite/binder resin sheet improves its thermal conductivity. Though a slurry of graphite, a binder resin and an organic solvent is coated by one step in JP 2006-86271 A, it has been found that one-step coating provides a non-uniform graphite distribution. In addition, because a mass ratio of graphite to a binder resin is not so high in Examples (80/20 in Example 1, and 89/11 in Example 2), inherently high thermal conductivity of graphite cannot be fully used.

JP 11-1621 A discloses a high-thermal-conductivity, solid composite material for a heat dissipater comprising highly oriented graphite flakes and a binder polymer polymerized under pressure. This solid composite material is produced by mixing graphite flakes with a thermosetting monomer such as an epoxy resin to prepare a composition comprising at least 40% by volume of graphite, and polymerizing the monomer while compressing the composition under sufficient pressure to align graphite substantially in parallel. JP 11-1621 A describes that the volume fraction of graphite in the composite material can be 40-95%, and is preferably 55-85%. However, graphite flakes are unevenly distributed in an epoxy resin containing graphite flakes at as high a concentration as 95%. Accordingly, JP 11-1621 A describes only experimental results when the volume fraction of graphite flakes is 60%.

As described above, conventional heat-dissipating sheets containing graphite blended with binder resins cannot sufficiently use high thermal conductivity of graphite because of low thermal conductivity of binder resins.

In addition, when the distribution of graphite is non-uniform, the heat-dissipating film exhibits further reduced heat dissipation, and provides non-uniform graphite distribution in a heat-dissipating film cut to a predetermined shape and size for being disposed in a small electronic appliance, resulting in unevenness performance.

OBJECT OF THE INVENTION

Accordingly, the first object of the present invention is to provide an inexpensive heat-dissipating film capable of exhibiting excellent heat dissipation when disposed in small electronic appliances, because flaky carbon is densely and uniformly distributed.

The second object of the present invention is to provide a method and an apparatus for producing such a heat-dissipating film at low cost.

DISCLOSURE OF THE INVENTION

As a result of intensive research in view of the above objects, the inventor has found that when a composite film comprising flaky carbon having excellent thermal conductivity and a small amount of a binder resin is burned and pressed, the binder resin is carbonized or burned off, resulting in a heat-dissipating film having a heat-conductive layer composed of densely bonded flaky carbon. The present invention has been completed based on such finding.

Thus, the heat-dissipating film of the present invention comprises a heat-conductive layer obtained by burning a mixture layer of flaky carbon and a binder resin to carbonize or burn off the binder resin, and plastic films covering the heat-conductive layer; the flaky carbon being aligned substantially in parallel in the heat-conductive layer; and the heat-conductive layer having a density of 1.9 g/cm$^3$ or more and thermal conductivity of 450 W/mK or more.

The flaky carbon is preferably graphite or graphene.

The heat-conductive layer preferably has a density of 2 g/cm$^3$ or more. Also, the heat-conductive layer preferably has thermal conductivity of 600 W/mK or more.

The heat-conductive layer preferably has a thickness (expressed by the weight of flaky carbon per 1 m$^2$) of 50-250 g/m$^2$.

The heat-dissipating film preferably has surface resistivity of 20 Ω/square or less. The heat-dissipating film preferably has an electromagnetic wave-shielding ratio (reflection ratio) of 90% or more.

The method of the present invention for producing the above heat-dissipating film comprises the steps of (1) sandwiching a mixture layer of flaky carbon and a binder resin with a pair of first plastic films to form a laminated film; (2) heat-pressing the laminated film to densify the mixture layer; (3) burning the mixture layer exposed by peeling the first plastic films to carbonize or burn off the binder resin in the mixture layer; (4) pressing the resultant burnt layer to form a densified heat-conductive layer; and (5) sealing the heat-conductive layer with second plastic films.

The mixture layer of the flaky carbon and the binder resin preferably comprises 5-25% by mass of flaky carbon and 0.05-2.5% by mass of a binder resin, and is formed preferably by repeating a step of applying an organic solvent dispersion, in which a mass ratio of the binder resin to the flaky carbon is 0.01-0.1, to a surface of each first plastic film and then drying the dispersion plural times.

The amount of the dispersion coated by one application is preferably 5-30 g/m$^2$ (expressed by the weight of flaky carbon per 1 m$^2$).

The binder resin is preferably an acrylic resin, a polystyrene resin or polyvinyl alcohol.

The organic solvent is preferably at least one selected from the group consisting of ketones, aromatic hydrocarbons and alcohols.

The application of the dispersion is preferably carried out by a spraying method.

The first plastic film preferably has a parting layer on a surface to be coated with the dispersion. The parting layer is preferably a deposited aluminum layer.

The drying step is carried out preferably at 30-100° C.

The heat pressing of the laminated film is carried out preferably by passing the laminated film between at least a pair of heating rolls. The heat-pressing temperature is preferably 150-250° C. The heat-pressing pressure is preferably 20 MPa or more.

The mixture layer is burned preferably by applying both surfaces thereof to flame, or exposing a die containing the mixture layer to a high temperature of 500° C. or higher, so that the binder resin in the mixture layer is carbonized. The mixture layer can be burned in air or an inert gas, or in vacuum.

The burnt layer is preferably pressed in a die constraining at least a pair of opposing sides of the burnt layer.

It is preferable that after the burnt layer is put in a cavity of the lower die part, the upper die part is combined with the lower die part such that the projection enters the cavity, and the combined upper and lower die parts are caused to pass through a gap between a pair of pressing rolls plural times, thereby densifying the burnt layer.

The burnt layer in the die is preferably pressed under vibration.

The second plastic film is preferably thinner than the first plastic film. The heat-conductive layer is preferably heat-sealed by the second plastic films. The second heat-sealing plastic film preferably has a sealant layer on a side attached to the heat-conductive layer.

The heat-conductive layer is preferably cut to a desired shape, and then sealed with the second plastic films.

The apparatus of the present invention for producing the above heat-dissipating film comprises (a) means for conveying a pair of first plastic films; (b) at least one dispersion-applying means disposed for each first plastic film for applying a dispersion comprising flaky carbon and a binder resin to the first plastic film plural times; (c) a means for drying the dispersion after each application; (d) a means for laminating a pair of the first plastic films each having the resultant mixture layer of the flaky carbon and the binder resin, with the mixture layer inside; (e) a means for heat-pressing the resultant laminated film; (f) a means for peeling the first plastic films from the laminated film; (g) a means for burning the mixture layer to carbonize or burn off the binder resin in the exposed mixture layer; (h) a pressing die means for densifying the resultant burnt layer to form a heat-conductive layer; and (i) a means for sealing the heat-conductive layer with the second plastic films.

The apparatus of the present invention preferably comprises pluralities of dispersion-applying means arranged with predetermined intervals along the moving direction of each first plastic film.

It is preferable that a pair of dispersion-applying means and the laminating rolls are disposed in the chamber, and that the chamber comprises first openings through which the first plastic films enter, a pair of hot air inlets disposed near the first openings, a gas outlet, and a second opening through which the laminated film exits. In the case of comprising plural pairs of dispersion-applying means, all dispersion-applying means are preferably disposed in the chamber.

Each first plastic film is preferably conveyed horizontally on both sides of the laminating rolls by the means (a).

The dispersion-applying means is preferably a spraying nozzle.

Both of the laminating means and the heat pressing means are preferably heat rolls.

The means for burning the mixture layer is preferably a burner ejecting a flame to both surfaces of the mixture layer, or a die containing the mixture layer and exposed to a high temperature of 500° C. or higher.

The pressing die means for densifying the burnt layer preferably comprises (a) a die comprising a lower die part having a cavity, and an upper die part having a projection engageable with the cavity; (b) a pair of rolls for pressing the die from above and below; (c) guide plates extending upstream and downstream of a roll gap; and (d) a means for reciprocating the die along the guide plates, such that it passes through a gap between a pair of the pressing rolls.

The pressing die means preferably further comprises a means for giving vibration to one of the pressing rolls, thereby densifying the burnt layer by pressing under vibration

DESCRIPTION OF THE PREFERRED EMBODIMENTS

The embodiments of the present invention will be explained in detail below referring to the attached drawings without intention of restriction, and various modifications may be made within the scope of the present invention. Unless otherwise mentioned, explanations of one embodiment are applicable to other embodiments.

[1] Heat-Dissipating Film

Figure 1:
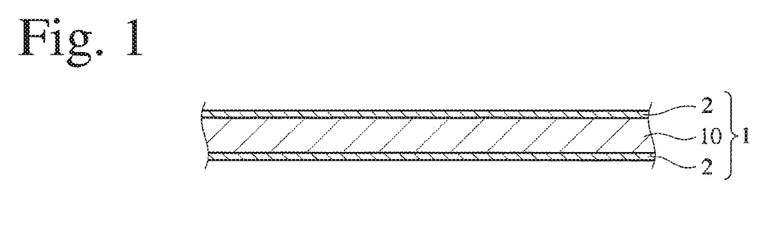
FIG. 1 is a cross-sectional view showing the heat-dissipating film of the present invention.

As shown in FIG. 1, the heat-dissipating film 1 of the present invention comprises a heat-conductive layer 10, and a pair of plastic films 2, 2 adhered to both surfaces of the heat-conductive layer 10 for sealing.

(1) Heat-Conductive Layer

The heat-conductive layer 10 obtained by burning a mixture layer of flaky carbon and a binder resin is mainly composed of flaky carbon. The flaky carbon is preferably graphite or graphene. Unless otherwise mentioned, they are explained as flaky carbon below.

(a) Flaky Carbon

Flaky graphite and flaky graphene have a planar multilayer structure constituted by two-dimensionally connected benzene rings. Because both of them have a hexagonal lattice structure, each carbon atom is bonded to three carbon atoms, one of four peripheral electrons used for chemical bonding being in a free state (free electron). Because free electrons can move along the crystal lattice, flaky graphite has high thermal conductivity.

Figure 2:
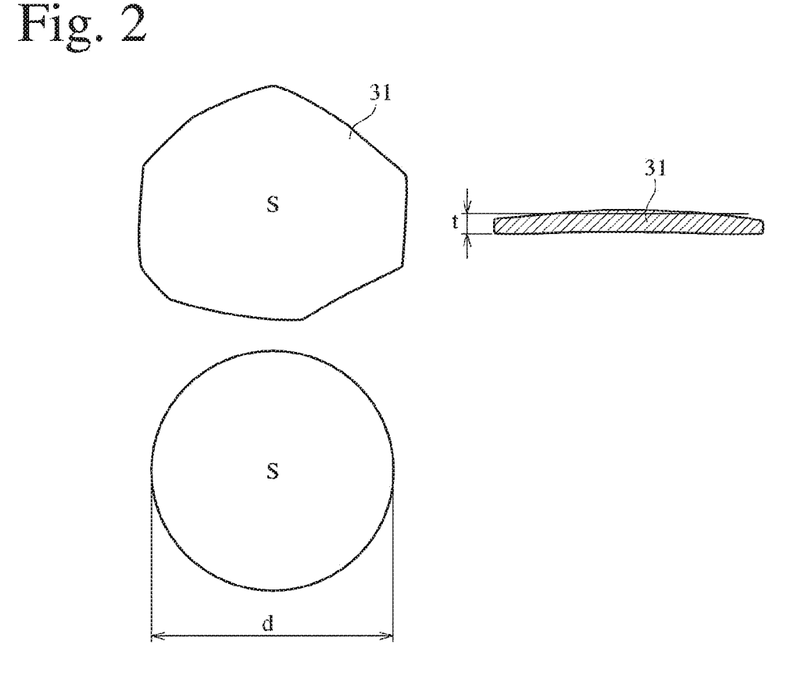
FIG. 2 is a schematic view showing a method for determining the particle size of flaky carbon.

Because both of them have a plate-like shape, their sizes are represented by the diameters of their planar surfaces. Because flaky graphite (graphene) 31 has a planar contour of an irregular shape as shown in FIG. 2, the size (diameter) of each flaky graphite (graphene) 31 is defined as a diameter d of a circle having the same area S. Because the size of each flaky graphite (graphene) 31 is expressed by a diameter d and a thickness t, the average diameter of flaky graphite (graphene) 31 used is expressed by $(\Sigma d)/n$, wherein n represents the number of flaky graphite (graphene) 31 measured, and the average thickness of flaky graphite (graphene) 31 is expressed by $(\Sigma t)/n$. The diameter d and thickness t of flaky graphite (graphene) 31 can be determined by the image treatment of a photomicrograph of flaky graphite (graphene) 31.

The average diameter of flaky graphite may be in a range of 5-100 μm. When the average diameter of flaky graphite is less than 5 μm, bonded carbon atoms are not sufficiently long, providing the heat-conductive layer 10 with too small thermal conductivity. On the other hand, flaky graphite having an average diameter of more than 100 μm would make spray coating difficult. The average diameter of flaky graphite is preferably 5-50 μm, more preferably 10-30 μm. The average thickness of flaky graphite is 200 nm or more, preferably 200 nm to 10 μm, more preferably 200 nm to 5 μm.

The average diameter of flaky graphene may be in a range of 5-100 μm. When the average diameter of flaky graphene is less than 5 μm, bonded carbon atoms are not sufficiently long, providing the heat-conductive layer 10 with too small thermal conductivity. On the other hand, flaky graphene having an average diameter of more than 100 μm would make spray coating difficult. The average diameter of flaky graphene is preferably 5-50 μm, more preferably 10-30 μm. The average thickness of flaky graphene may be in a range of 5-50 nm. When the average thickness of flaky graphene is less than 5 nm, the heat-conductive layer 10 obtained by burning the flaky graphene/binder resin mixture has large resistance. On the other hand, when the average thickness of flaky graphene is more than 50 nm, flaky graphene is easily broken when it is uniformly dispersed in a solvent. The average thickness of flaky graphene is preferably 5-30 nm, more preferably 10-25 nm.

(b) Binder Resin

The binder resin is not particularly restricted, as long as it can be dissolved in an organic solvent and can uniformly disperse flaky carbon. It may be acrylic resins such as polymethylacrylate and polymethylmethacrylate, polystyrenes, polycarbonates, polyvinyl chloride, ABS resins, low-stereospecific polypropylene, atactic polypropylene, etc. Among them, polymethylmethacrylate, polystyrenes and low-stereospecific polypropylene are preferable.

(c) Comprising Ratio

A smaller mass ratio of the binder resin to flaky carbon can provide the heat-conductive layer 10 with higher density and thermal conductivity. However, too low a percentage of the binder resin provides insufficient strength of adhering flaky carbon in the mixture layer, so that the mixture layer is easily broken. To have high thermal conductivity and strength, the binder resin/flaky carbon mass ratio is preferably 0.01-0.1. The upper limit of the binder resin/flaky carbon mass ratio is more preferably 0.08, most preferably 0.06. Though the lower limit of the binder resin/flaky carbon mass ratio is preferably as low as possible as long as flaky carbon is securely bonded, it is 0.01 as a technical limit, and practically 0.03.

(d) Uniform Distribution of Flaky Carbon

If flaky carbon were not uniformly distributed in the mixture layer, (a) flaky carbon would be agglomerated, generating regions with insufficient fine flaky carbon, and thus failing to provide the heat-dissipating film with desired thermal conductivity; and (b) the resultant heat-dissipating film would have non-uniform thermal conductivity distribution, providing insufficient thermal conductivity when divided to pieces for individual electronic appliances or parts. To obtain a heat-conductive layer with uniform thermal conductivity distribution, a mixture layer of uniformly distributed flaky carbon should be formed in each application step.

When flaky carbon is agglomerated in the mixture layer, the mixture layer has regions in which flaky carbon is agglomerated, and regions free of or scarcely containing flaky carbon. Because the existence of regions free of or scarcely containing flaky carbon provides the heat-conductive layer with low thermal conductivity as a whole, flaky carbon should be dispersed as uniformly as possible.

(e) Surface Resistivity

The heat-dissipating film of the present invention can also function as an electromagnetic wave-shielding film. To exhibit a sufficient electromagnetic wave-shielding function, the surface resistivity of the heat-conductive layer 10 is preferably 20 Ω/square or less, more preferably 10 Ω/square or less. The surface resistivity is measured by a DC two-terminal method on a square specimen of 10 cm×10 cm cut out of the heat-conductive layer 10.

(f) Thickness

The thermal conductivity of the heat-conductive layer 10 depends on the thickness of the heat-conductive layer 10. Because what largely contributes to thermal conductivity is flaky carbon in the heat-conductive layer 10 composed of flaky carbon and a binder resin at least partially carbonized by burning, the thickness of the heat-conductive layer 10 is preferably expressed by the amount of flaky carbon per a unit area. The thickness of the heat-conductive layer 10, which is expressed by the amount of flaky carbon per a unit area, is preferably 50-250 g/m$^2$, more preferably 70-220 g/m$^2$, most preferably 80-200 g/m$^2$.

(2) Plastic Film

Resins forming the plastic film are not particularly restricted, as long as they have sufficient strength, flexibility and formability in addition to insulation. They may be, for example, polyesters (polyethylene terephthalate, etc.), polyarylene sulfide (polyphenylene sulfide, etc.), polyether sulfone, polyether ether ketone, polyamides, polyimides, polyolefins (polypropylene, etc.), etc. The thickness of the plastic film may be about 5-20 μm.

(3) Cutting of Heat-Dissipating Sheet

Because a relatively large heat-dissipating sheet can be formed in the present invention, it may be cut to a proper size, so that it is attached to small electronic appliances. In such a case, the heat-conductive layer 10 is preferably cut with a cutter having flat portions on both sides of each blade, while fusing a cut portion of the plastic film 2 by heating or ultrasonic waves, to avoid the cut cross section of the heat-conductive layer 10 from being exposed. Alternatively, as described below, the heat-conductive layer 10 may be first cut to a predetermined size, and laminated with plastic films 2, which are then cut.

[2] Apparatus and Method for Producing Heat-Dissipating Film

Figure 6:
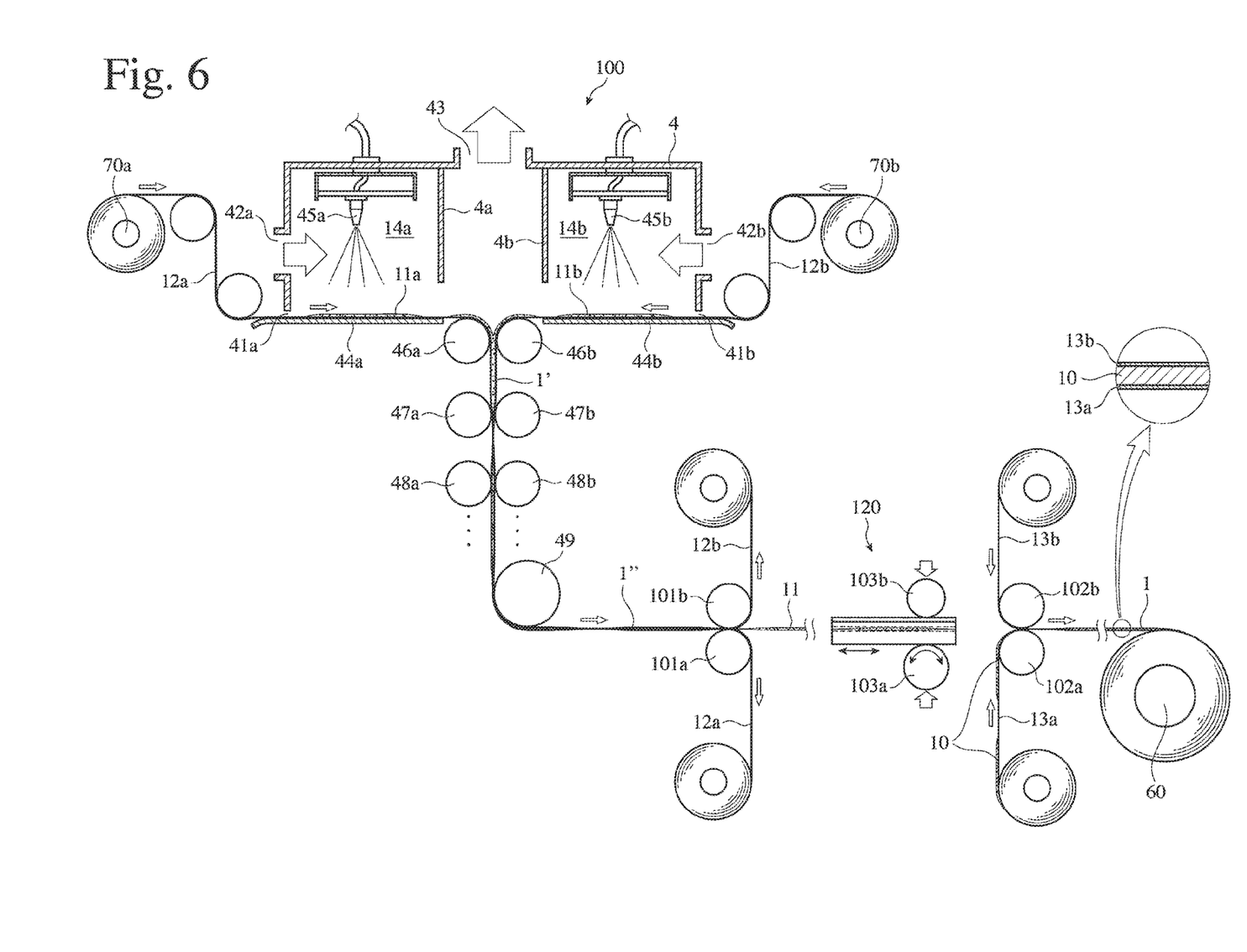
FIG. 6 is a cross-sectional view showing the apparatus of the present invention for producing a heat-dissipating film.

FIG. 6 schematically shows an apparatus 100 for producing a heat-dissipating film. In the depicted example, the apparatus comprises a pair of dispersion-applying means laterally arranged. The production apparatus 100 comprises (a) a chamber 4 comprising a pair of dispersion-applying regions 14a, 14b each having an inlet 41a, 41b of each first plastic film 12a, 12b and a hot air inlet 42a, 42b, and a gas outlet 43 disposed at a position at which both dispersion-applying regions 14a, 14b are merged; (b) a pair of nozzles 45a, 45b mounted to a ceiling of the chamber 4 in the dispersion-applying regions 14a, 14b for spraying a flaky carbon/binder resin dispersion to form mixture layers 11a, 11b on the first plastic films 12a, 12b; (c) a pair of rolls 46a, 46b for laminating the first plastic films 12a, 12b having the mixture layers 11a, 11b with the mixture layers 11a, 11b inside; (d) at least a pair of heating rolls (two pairs of heating rolls 47a, 47b, 48a, 48b in the depicted example) for heat-pressing the resultant laminated film 1'; (e) a guide roll 49 for conveying the laminated film 1'; (f) a pair of rolls 101a, 101b for peeling the first plastic films 12a, 12b from the laminated film 1'; (g) a means (not shown) for burning the exposed mixture layer 11; (h) a means 120 for pressing the resultant burnt layer 110; (i) a pair of rolls 102a, 102b for sealing the resultant heat-conductive layer 10 with a pair of second plastic films 13a, 13b; and (j) a reel 60 for winding up the resultant heat-dissipating film 1. The first plastic films 12a, 12b wound off from reels 70a, 70b are sent to the openings 41a, 41b laterally arranged in the chamber 4 via pluralities of guide rolls. Though each dispersion-applying region 14a, 14b has one dispersion-spraying nozzle 45a, 45b in the depicted example, of course, each dispersion-applying region 14a, 14b may have pluralities of nozzles.

To withstand the laminating step and the heat-pressing step, the first plastic films 12a, 12b should have sufficient mechanical strength and heat resistance. Accordingly, the first plastic films 12a, 12b are preferably relatively thick films made of heat-resistant resins. As the heat-resistant resins, polyethylene terephthalate, polyimides, etc. are preferable. The first plastic films 12a, 12b are preferably as thick as 20-60 μm. The first plastic film 12 can be used again after peeling.

However, the use of thick plastic films having low thermal conductivity provides a heat-dissipating sheet 1 having a structure comprising a heat-conductive layer 10 covered with plastic films on both surfaces with low thermal conductivity. Accordingly, the plastic films covering both surfaces of the heat-conductive layer 10 should be as thin as possible. Thus, the second plastic films 13a, 13b are preferably as thick as 5-15 μm. Each second plastic film 13a, 13b preferably has a sealant layer, such that it is strongly fused to the heat-conductive layer 10 by a heat lamination method, etc. Though materials for the second plastic films 13a, 13b may be the same as those for the first plastic films 12a, 12b, it is practically preferable to use commercially available extremely thin polyethylene terephthalate films.

The chamber 4 is provided with a pair of opened vertical walls 4a, 4b on both lateral sides of the gas outlet 43, and a region partitioned by each opened vertical wall 4a, 4b is a dispersion-applying region 14a, 14b having each nozzle 45a, 45b. There are horizontal plates 44a, 44b supporting the first plastic films 12a, 12b on both lateral sides of the laminating rolls 46a, 46b, and each first plastic film 12a, 12b is horizontally conveyed on each horizontal plate 44a, 44b.

(1) Preparation of Flaky Carbon Dispersion

A dispersion comprising flaky carbon, a binder resin and an organic solvent is preferably prepared by mixing a dispersion of flaky carbon in an organic solvent with a solution of a binder resin in an organic solvent. This is due to the fact that because flaky carbon is easily agglomerated, the simultaneous mixing of flaky carbon and a binder resin with an organic solvent likely results in the agglomeration of flaky carbon. In a flaky carbon dispersion obtained by mixing both solutions, the concentration of flaky carbon is preferably 5-25% by mass, more preferably 8-20% by mass, most preferably 10-20% by mass. A mass ratio of the binder resin to flaky carbon is 0.01-0.1. The mass ratio of the binder resin to flaky carbon is kept in the mixture layer without change.

Organic solvents used for the dispersion are preferably those well dispersing flaky carbon, dissolving the binder resin, and easily evaporating to shorten the drying time. Examples of such organic solvents include ketones such as methyl ethyl ketone, aliphatic hydrocarbons such as hexane, etc., aromatic hydrocarbons such as xylene, etc., and alcohols such as isopropyl alcohol, etc. Among them, methyl ethyl ketone, xylene, etc. are preferable. They may be used alone or in combination.

(2) Application and Drying of Dispersion

Figure 3:
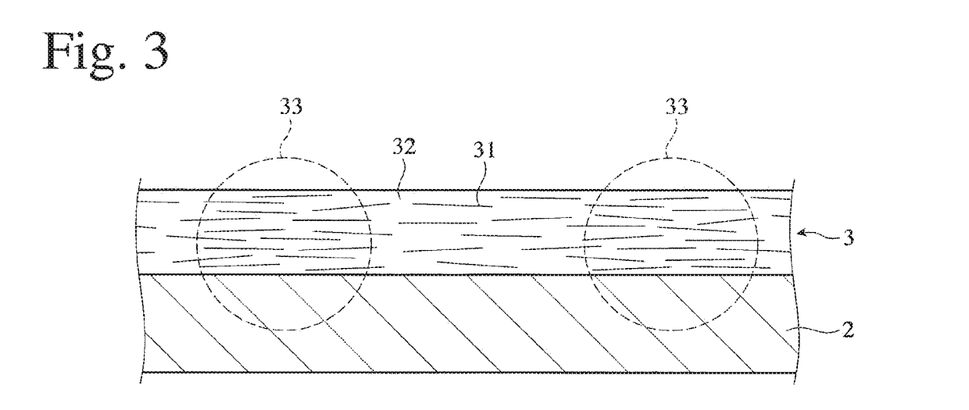
FIG. 3 is a cross-sectional view showing a state where flaky carbon is agglomerated as a result of thickly applying a flaky carbon/binder resin dispersion on a plastic film.

It has been found that when a dispersion having a desired concentration is applied to a plastic film by one operation, flaky carbon 31 in the dispersion 3 is agglomerated in a drying process as schematically shown in FIG. 3. In FIG. 3, 33 represents regions in which the flaky carbon 31 is agglomerated. Intensive research has revealed that when a dispersion is divided to as small amounts as possible and applied plural times, the agglomeration of flaky carbon 31 can be prevented. In the first application shown in FIG. 4, a dispersion layer 3a is in a small amount, and its thickness is sufficiently small relative to an average diameter of flaky carbon 31, so that the dispersion of flaky carbon 31 is kept without agglomeration when the dispersion layer 3a is dried. Accordingly, flaky carbon 31 bonded with a trace amount of a binder resin is substantially uniformly distributed in a mixture layer 3a' obtained by drying the dispersion layer 3a.

The amount of a dispersion applied by one operation is preferably 5-30 g/m², more preferably 7-20 g/m², as the weight of flaky carbon per a unit area. When the amount of a dispersion is less than 5 g/m², it takes too much time to form the mixture layer. When the amount of a dispersion applied by one operation exceeds 30 g/m², flaky carbon is likely agglomerated. To apply such a small amount of a dispersion uniformly, a spraying method is preferable.

Figure 4:
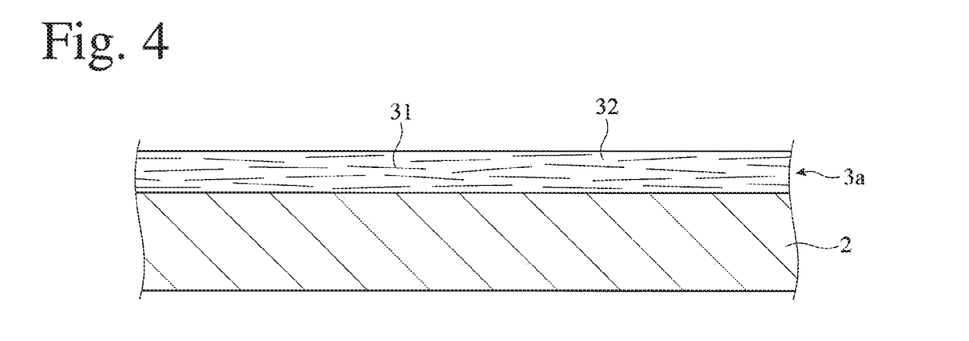
FIG. 4 is a cross-sectional view schematically showing a state where flaky carbon is uniformly dispersed as a result of thinly applying a dispersion on a plastic film.

After the dispersion layer 3a is dried, the next application is carried out. Though the dispersion layer 3a may be spontaneously dried, heating may be carried out to such an extent as to avoid the deformation of the plastic film, to reduce the application time. The heating temperature is determined depending on the boiling point of an organic solvent used. For example, when methyl ethyl ketone is used, the heating temperature is preferably 30-100° C., more preferably 50-80° C. Drying need not be carried out until an organic solvent in the applied dispersion layer 3a is completely evaporated, but may be carried out to such a level that flaky carbon does not become free in the next application.

Figure 5:
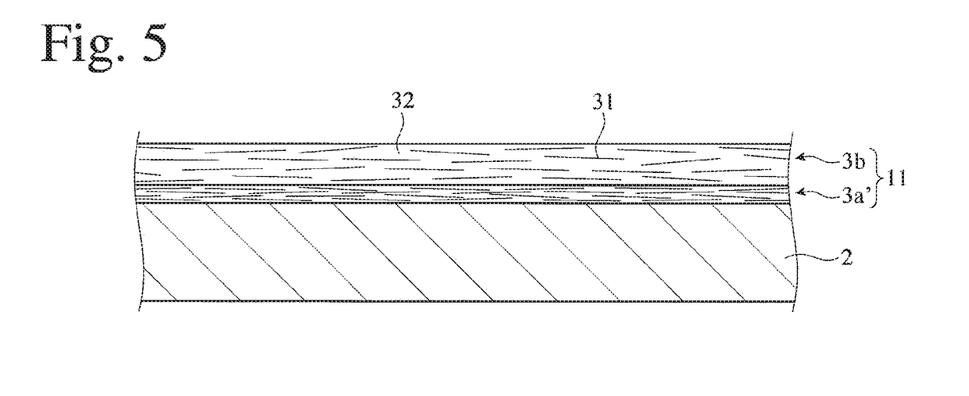
FIG. 5 is a cross-sectional view showing a state where a flaky carbon dispersion is thinly applied after the dispersion applied to the plastic film is dried.

When the second application of a dispersion is carried out on the dried first mixture layer 3a', a new dispersion layer 3b is formed substantially without dissolving the first mixture layer 3a', as schematically shown in FIG. 5. When the dispersion layer 3b is dried, the second mixture layer 3b' is formed integrally with the first mixture layer 3a'. Thus, by repeating a cycle of applying and drying the dispersion plural times, a relatively thick, integral mixture layer comprising flaky carbon aligned in parallel is obtained. The number of cycles of applying and drying the dispersion is determined depending on the thickness of a mixture layer to be formed.

To carry out the above step of applying and drying the dispersion by the apparatus 100 shown in FIG. 6, the first plastic films 12a, 12b wound off from the reels 70a, 70b are first stopped in the chamber 4. In this state, a portion of each first plastic film 12a, 12b in each dispersion-applying region 14a, 14b is uniformly sprayed with a dispersion ejected from each nozzle 45a, 45b. To achieve the uniform application of a dispersion, each nozzle 45a, 45b is freely movable. A dispersion layer formed on each of the first plastic films 12a, 12b is dried by hot air. By repeating this step of applying and drying a dispersion plural times, a mixture layer 11a, 11b having predetermined thickness is formed on each of the first plastic films 12a, 12b.

(3) Lamination and Heat Pressing of Mixture Layer

When the first plastic films 12a, 12b, on which the mixture layers 11a, 11b are formed, are laminated by a pair of rolls 46a, 46b with the mixture layers 11a, 11b inside, the mixture layers 11a, 11b are adhered to each other to form an integral mixture layer 11.

The laminating rolls 46a, 46b are preferably heated to a high temperature, such that the mixture layers 11a, 11b are completely fused to each other by lamination. Though variable depending on the type of the binder resin, the temperature of the laminating rolls 46a, 46b is preferably 100-250° C., more preferably 150-200° C. The pressing pressure of the laminating rolls 46a, 46b may not be high, but may be, for example, 1-10 MPa.

To a new portion of each first plastic film 12a, 12b reaching the dispersion-applying region 14a, 14b, a step of applying and drying a dispersion is repeated plural times, to form each mixture layer 11a, 11b having predetermined thickness. Thus, after the step of applying and drying a dispersion is repeated plural times, each first plastic film 12a, 12b is intermittently conveyed to form a laminated film 1' intermittently having mixture layers 11 between a pair of first plastic films 12a, 12b.

As shown in FIGS. 4 and 5, flaky carbon 31 is dispersed substantially in parallel in the dispersion layer 3a, but it is not completely in parallel. Accordingly, only an organic solvent among the flaky carbon 31 is evaporated when the dispersion layer 3a is dried, leaving voids among substantially parallel flaky carbon particles 31 bonded with a trace amount of the binder resin. Because the mixture layers 3a' having voids among flaky carbon particles 31 are laminated, the mixture layers 11a, 11b to be laminated are porous. Accordingly, the mere lamination of the first plastic films 12a, 12b having the mixture layers 11a, 11b would not form a dense mixture layer 11.

Accordingly, a laminated film 1' obtained by passing the laminating roll pairs 46a, 46b should be heat-pressed by single-stage or multi-stage heat-pressing roll pairs 47a, 47b, 48a, 48b disposed downstream. Variable depending on the type of a binder resin, the heat-pressing conditions are preferably a temperature of 100-250° C. and pressure of 20 MPa (about 200 kgf/cm$^2$) or more. When the heat-pressing temperature is lower than 100° C., the heat-conductive layer 10 is not sufficient densified. Also, even if the heat-pressing temperature is elevated to higher than 250° C., the binder resin is not provided with higher fluidity, economically disadvantageous. The heat-pressing temperature is preferably 120-200° C., more preferably 150-180° C. When the heat-pressing pressure is less than 20 MPa, the mixture layer 11 is not sufficiently densified.

Though the heat-pressing rolls 47a, 47b, 48a, 48b may be arranged in a single- or multi-stage, their multi-stage arrangement is preferable to produce a laminated film 1' comprising a sufficiently dense mixture layer 11. The number of stages of the heat-pressing rolls 47a, 47b, 48a, 48b may be properly determined depending on a compression rate.

(4) Burning of Mixture Layer

Figure 7:
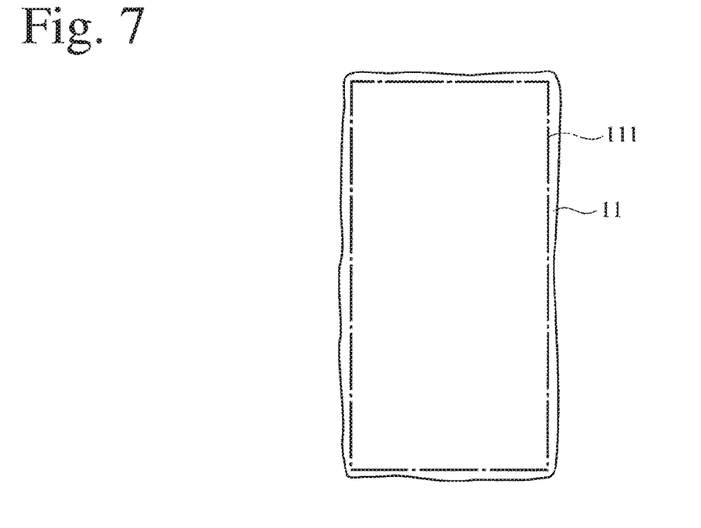
FIG. 7 is a plan view showing a cutting line along which a margin of a mixture layer is cut off.
Figure 8A:
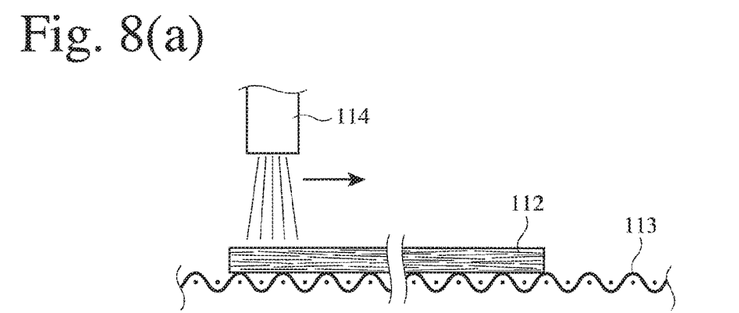
FIG. 8(a) is a schematic cross-sectional view showing an example of burning methods of a mixture layer.

Because the heat-pressed mixture layer 11 has slightly rugged or irregular edge portions due to the flowing of the binder resin, it is preferably cut to a predetermined shape and size, for example, along the broken line 111 as shown in FIG. 7. For example, as shown in FIG. 8(a), the cut mixture layer 112 is placed on a wire net 113, and burned by flame at about 900-1200° C., which is ejected from a burner 114. Burning may be carried out only on one surface of the mixture layer 112, but it is preferable to burn both surfaces of the mixture layer 112. The binder resin is carbonized or burned off in the mixture layer 112 exposed to flame ejected from the burner 114. Amorphous carbon generated by carbonizing the binder resin may remain among the flaky carbon. Because of volume reduction by carbonizing or burning off the binder resin, voids generated thereby are removed by pressing to densify the flaky carbon, thereby providing a heat-conductive layer 10 having higher thermal conductivity.

Figure 8B:
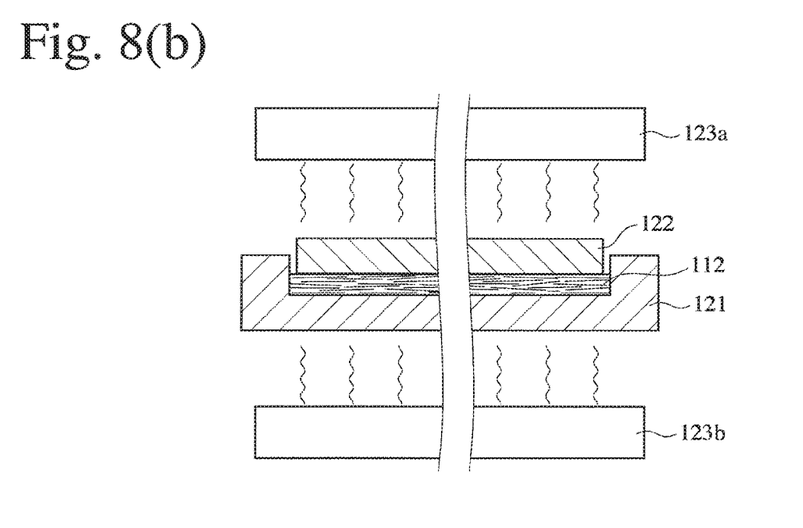
FIG. 8(b) is a schematic cross-sectional view showing another example of burning methods of a mixture layer.

FIG. 8(b) shows another method of burning the mixture layer 112. This method uses a die comprising a lower die part 121 having a cavity and an upper die part 122 slightly larger than the cavity. After the mixture layer 112 is put in the lower die part 121, the upper die part 122 is placed on the mixture layer 112, and sandwiched by a pair of heaters 123a, 123b to heat the mixture layer 112. The temperature of the heaters 123a, 123b may be about 500-1000° C., and the heating time is determined to avoid the binder resin from being excessively burned off. The burning of the mixture layer may be carried out in air or an inert gas, or in vacuum.

The carbonization or burning-off of the binder resin by burning the mixture layer includes not only when the binder resin is 100% carbonized or burned off, but also when the binder resin is partially carbonized or burned off. Though the binder resin is carbonized or burned off preferably as much as possible to obtain high thermal conductivity, at least 90% of the binder resin need only be carbonized or burned off.

(5) Pressing of Burnt Layer

Figures 9A, 9B:
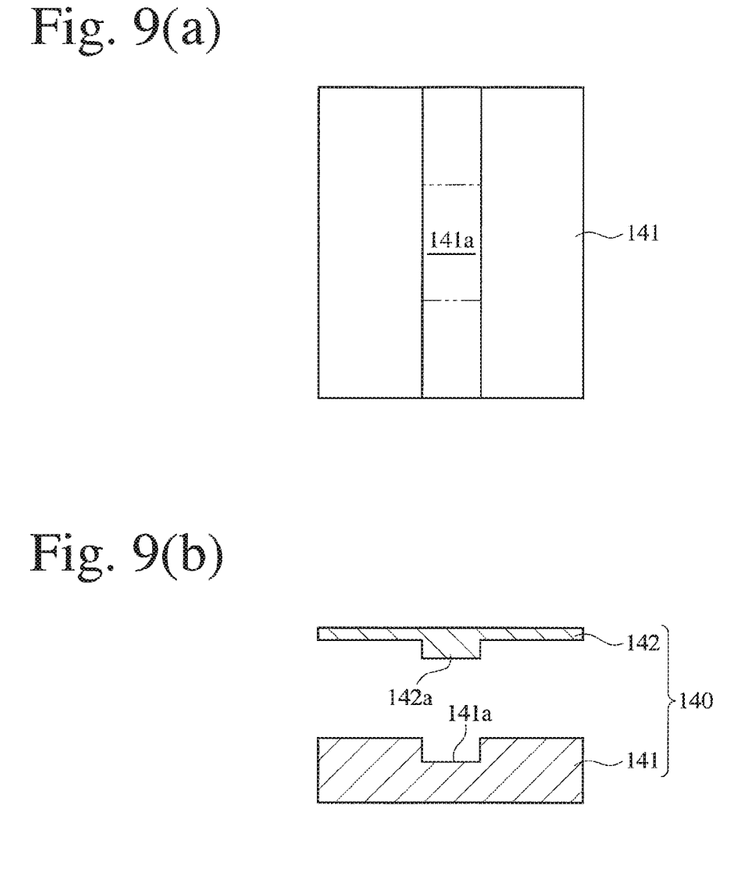
FIG. 9(a) is a plan view showing a lower die part in a burnt layer-pressing apparatus.
FIG. 9(b) is an exploded cross-sectional view showing upper and lower die parts in a burnt layer-pressing apparatus.
Figure 10:
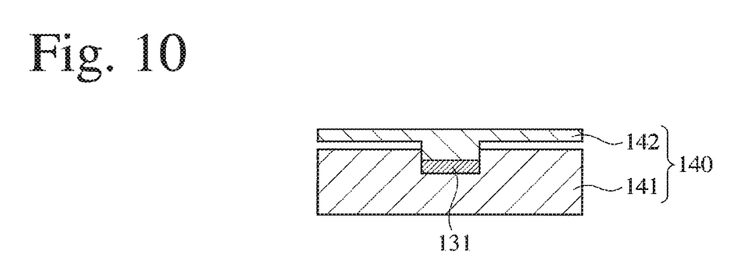
FIG. 10 is a cross-sectional view showing the pressing of a burnt layer by a die comprising upper and lower die parts.

To densify the burnt layer 131, a die 140 comprising a lower die part 141 having a cavity 141a, and an upper die part 142 having a projection 142a received in the cavity 141a is used as shown in FIGS. 9(a) and 9(b). In the depicted example, the cavity 141a longitudinally extends in the lower die part 141, with the same width as that of the burnt layer 131. As shown in FIG. 10, after the burnt layer 131 is put in the cavity 141a, the upper die part 142 is placed on the lower die part 141, such that the projection 142a covers the burnt layer 131. In this case, because the thickness of the burnt layer 131 is sufficiently smaller than the depth of the cavity 141a, the projection 142a of the upper die part 142 enters the cavity 141a, thereby accurately positioning the upper die part 142 relative to the lower die part 141.

Figure 11A:
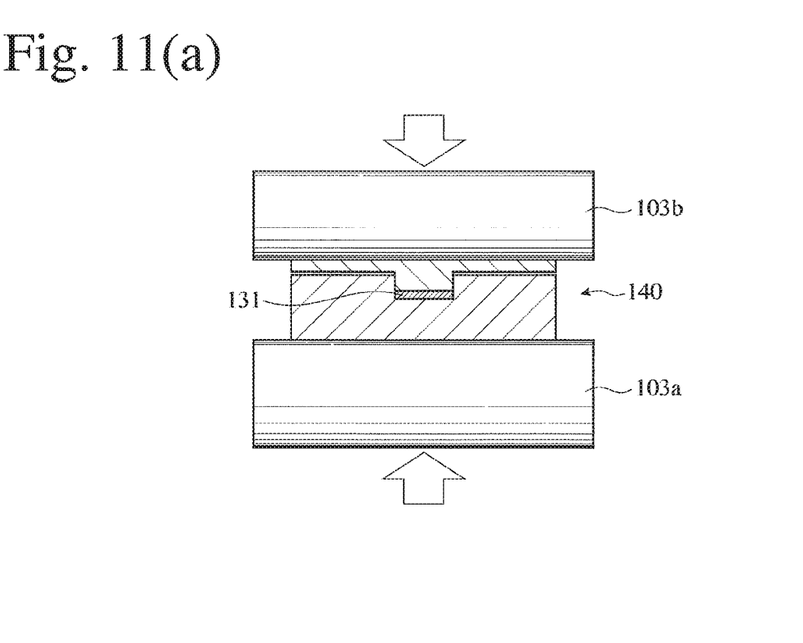
FIG. 11(a) is a partial cross-sectional view showing the pressing of the die of FIG. 10 by a pair of pressing rolls.
Figure 11B:
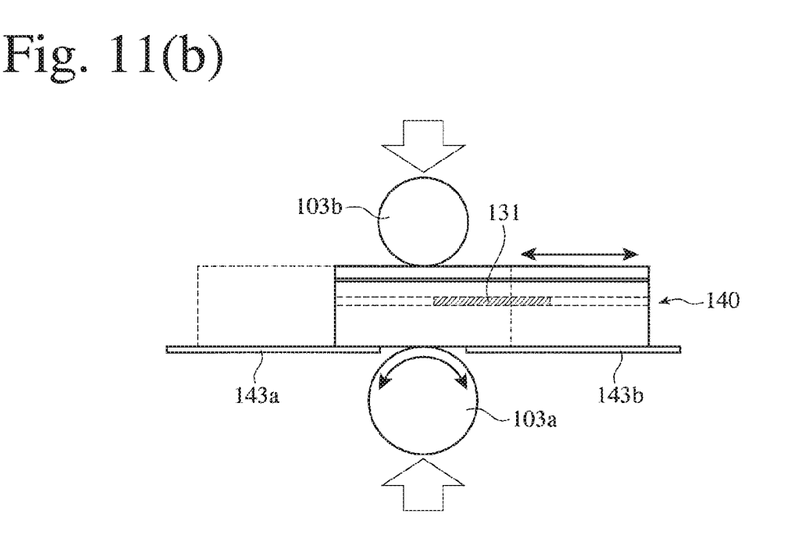
FIG. 11(b) is a partial cross-sectional view showing the repeated pressing of the die of FIG. 10 by a pair of pressing rolls.

As shown in FIGS. 6, 11(a) and 11(b), a pressing die means for densifying the burnt layer 131 comprises (a) a die 140 comprising a lower die part 141 and an upper die part 142 combined to sandwich the burnt layer 131, (b) a pair of rolls 103a, 103b for pressing the die 140, (c) guide plates 143a, 143b extending upstream and downstream of the gap of the rolls 103a, 103b, and (d) a means (not shown) for reciprocating the die 140 along the guide plates 143a, 143b such that the die 140 passes through the gap of a pair of pressing rolls 103a, 103b.

Among a pair of pressing rolls 103a, 103b, the lower pressing roll 103a is a driving roll, and the upper pressing roll 103b is a follower roll. With the follower roll 103b having a slightly smaller diameter than that of the driving roll 103a, the upper die part 142 is not bent by pressing. The reciprocation range of the die 140 is sufficiently longer than the burnt layer 131. Reciprocation may be conducted once or several times. A pressing force applied to the die 140 may be increased as passing through the gap of the pressing rolls 103a, 103b. The burnt layer 131 is turned to a heat-conductive layer 10 by pressing the die 140.

With the lower pressing roll 103a vibrated by a vibration motor (not shown), the burnt layer 131 is further densified. The vibration frequency is preferably 50-500 Hz, more preferably 100-300 Hz.

Figures 12A, 12B:
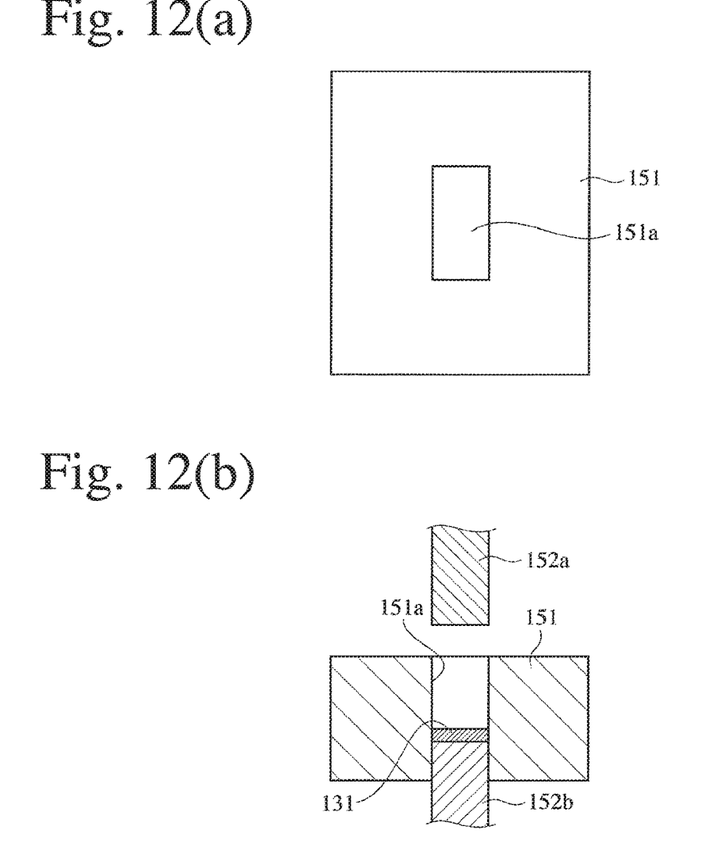
FIG. 12(a) is a plan view showing a burnt layer-pressing die.
FIG. 12(b) is a cross-sectional view showing a burnt layer-pressing die.

FIGS. 12(a) and 12(b) show another example of dies used in the pressing means for densifying the burnt layer. This die 150 comprises a die body 151 having a vertically penetrating cavity 151a, an upper punch 152a inserted into the cavity 151a from above, and a lower punch 152b inserted into the cavity 151a from below. After the lower punch 152b is inserted into the cavity 151a, a burnt layer 131 is put on the lower punch 152b, and the upper punch 152a inserted into cavity 151a from above is moved downward to press the burnt layer 131 for densification. With the same vibration as above applied to the upper punch 152a, a larger pressing effect is obtained.

(6) Sealing of Heat-Conductive Layer

Figure 13:
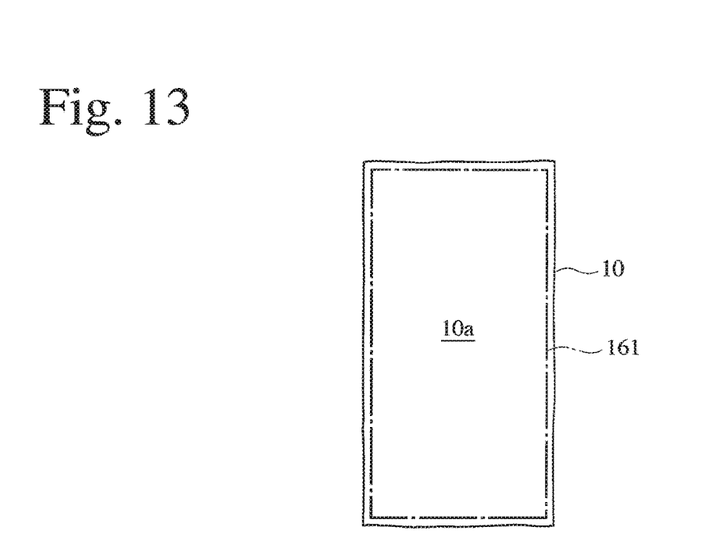
FIG. 13 is a plan view showing a cutting line along which a margin of the pressed heat-conductive layer is cut off to provide the pressed heat-conductive layer with a predetermined size.
Figure 14:
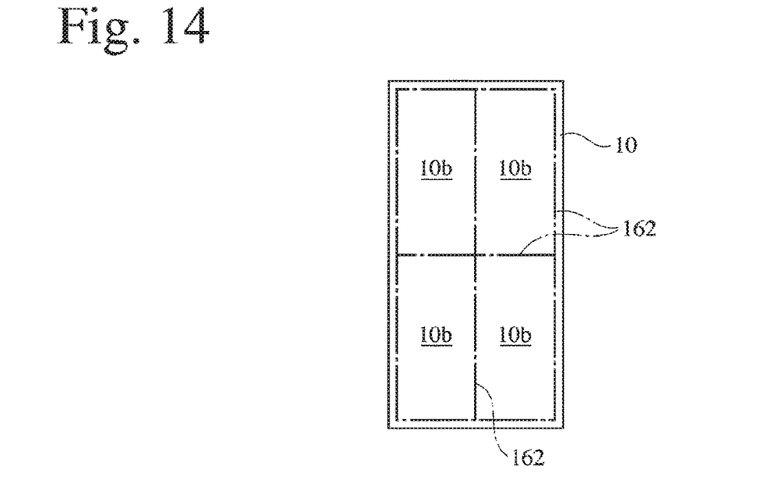
FIG. 14 is a plan view showing cutting lines along which the pressed heat-conductive layer is divided to those having a final shape.

Because the pressed heat-conductive layer 10 has slight irregularity in edge portions, (1) the edge portions are cut off from the heat-conductive layer 10 along the broken line 161 to obtain a heat-conductive layer 10a of a predetermined size as shown in FIG. 13, or (2) the heat-conductive layer 10 is divided along the broken lines 162 to heat-conductive layers 10b of a final size as shown in FIG. 14. In the case shown in FIG. 14, the size, shape and number of the heat-conductive layers 10b may be arbitrarily determined.

Figure 15:
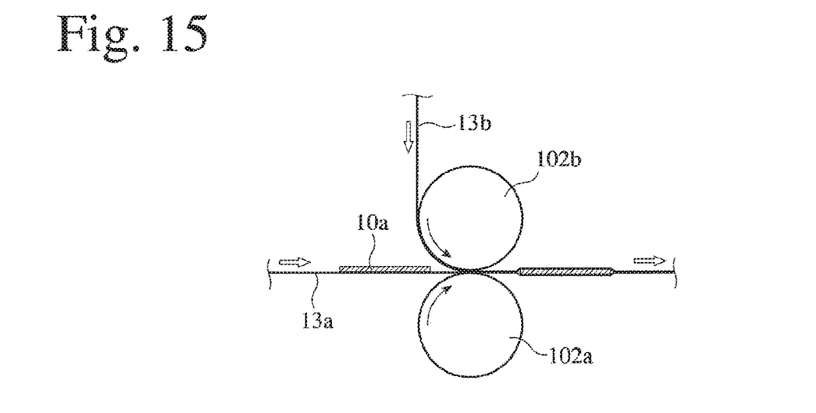
FIG. 15 is a cross-sectional view showing a method of laminating a second plastic film of FIG. 13 having heat-conductive layers to another second plastic film.

In the case of a large heat-conductive layer 10a as shown in FIG. 13, a second plastic film 13a to which the heat-conductive layers 10a are attached with predetermined intervals is laminated with another second plastic film 13b by a pair of rolls 102a, 102b, and the laminated film is cut in every heat-conductive layer 10a to obtain individual heat-dissipating films, as shown in FIG. 15. With the second plastic film 13a having an adhesive layer, the attached heat-conductive layers 10a are not displaced. The second plastic films 13a, 13b are preferably heat-laminated via the heat-conductive layers 10a.

Figure 16A:
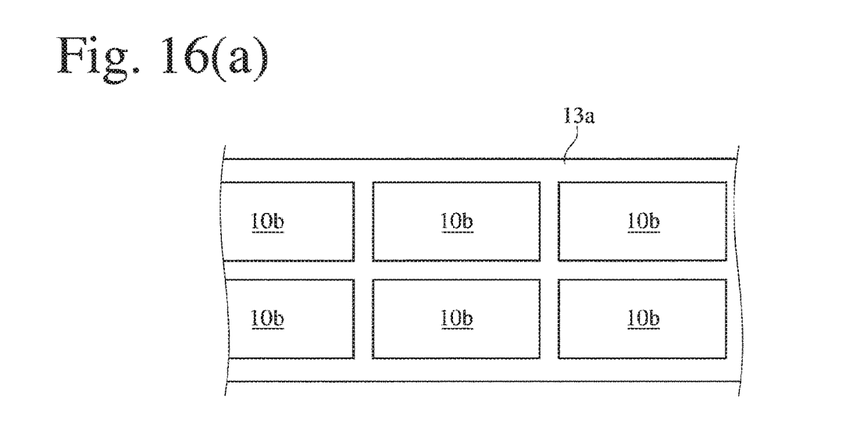
FIG. 16(a) is a plan view showing heat-conductive layers of a final shape attached to a second plastic film.
Figure 16B:
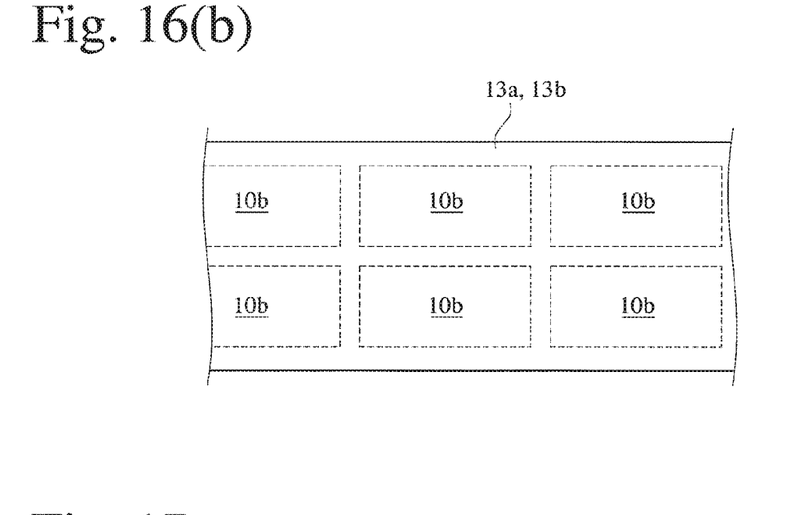
FIG. 16(b) is a plan view showing a laminate comprising a second plastic film to which heat-conductive layers of a final shape are attached, and another second plastic film.
Figure 17:
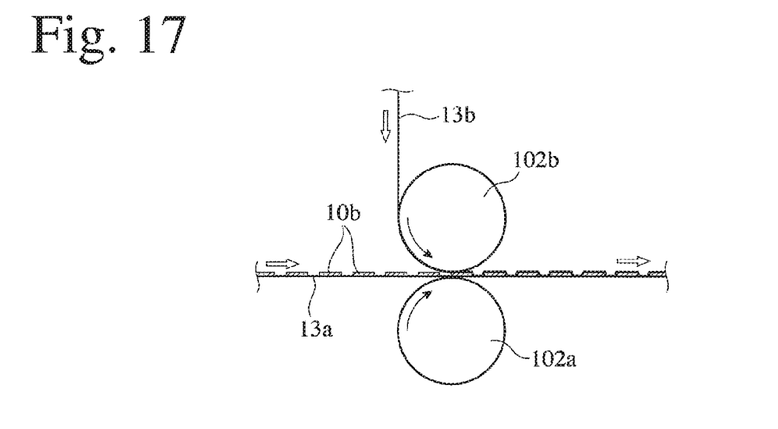
FIG. 17 is a cross-sectional view showing a method of laminating a second plastic film having heat-conductive layers of a final shape to another second plastic film.
Figure 18:
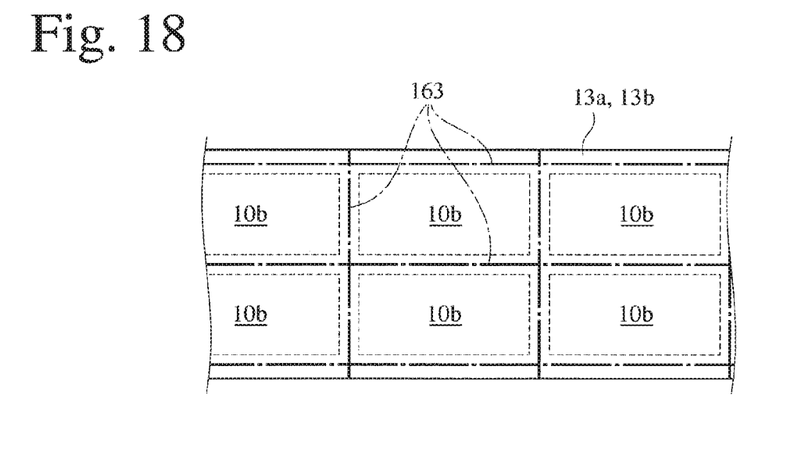
FIG. 18 is a plan view showing cutting lines for dividing a laminate having heat-conductive layers of a final shape to individual heat-dissipating films.

When cut to heat-conductive layers 10b of a final size as shown in FIG. 14, one second plastic film 13a, to which pluralities of heat-conductive layers 10b are attached with predetermined intervals as shown in FIG. 16(a), is first laminated with another second plastic film 13b by a pair of rolls 102a, 102b as shown in FIG. 17, to obtain a laminated film shown in FIG. 18. As shown in FIG. 18, the laminated film is divided along the broken lines 163 to obtain individual heat-dissipating films.

Figure 19:
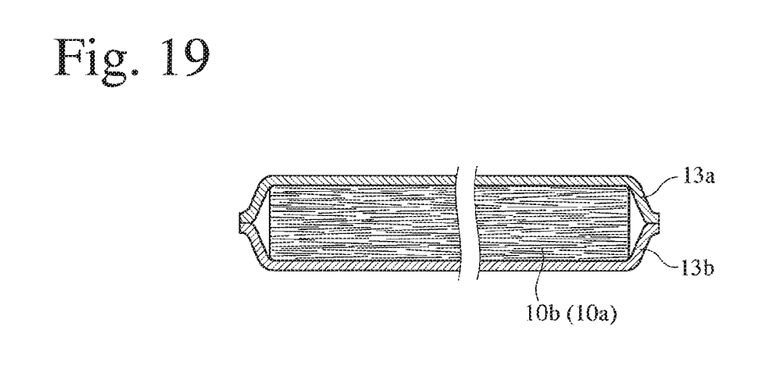
FIG. 19 is a cross-sectional view showing a heat-dissipating film comprising a heat-conductive layer sealed by a pair of second plastic films.

As shown in FIG. 19, each heat-conductive layer 10a (10b) is sandwiched by a pair of second plastic films 13a, 13b, whose edge portions are heat-sealed.

The present invention will be explained in further detail by Examples below, without intention of restricting the present invention thereto.

Example 1

A dispersion comprising 25% by mass of flaky graphite (UP-35N available from Nippon Graphite Industries, Co., Ltd., ash: less than 1.0%, and average particle size: 25 μm), 1.25% by mass of polymethylmethacrylate (PMMA), and 73.75% by mass of methyl ethyl ketone was applied to each aluminum-deposited surface of two aluminum-deposited polyethylene terephthalate (PET) films (first plastic films) 12a, 12b as thick as 30 μm, and dried at 40° C. for 2 minutes to obtain each coating layer of flaky graphite and PMMA having a thickness of 50 g/m$^2$ (expressed by the grams of flaky graphite per 1 m$^2$). This procedure was repeated 5 times in total to form a mixture layer 11a, 11b (thickness: 100 g/m$^2$) of flaky graphite and PMMA on each PET film 12a, 12b.

As shown in FIG. 6, a pair of PET films 12a, 12b each having a mixture layer 11a, 11b were laminated at 120° C. by a pair of rolls 46a, 46b, with the mixture layers 11a, 11b inside, and then heat-pressed at 150° C. under 20 MPa by plural pairs of heating rolls 47a, 47b, 48a, 48b, to form a laminated film 1' comprising the mixture layer 11.

After peeling both PET films 12a, 12b from the laminated film 1', each surface of the mixture layer 11 was exposed to a flame (temperature: about 1000° C.) ejected from a gas burner 114 shown in FIG. 8(a), to burn the mixture layer 11. The burnt layer was placed in a cavity 141a of the die 140 shown in FIG. 9, and repeatedly pressed under a load of 7 tons by a pair of rolls 103a, 103b with vibration of 200 Hz, as shown in FIGS. 11(a) and 11(b).

After the resultant heat-conductive layer 10 was cut to a predetermined size, its density, specific heat, and heat diffusivity (m$^2$/s) in in-plane and thickness directions were measured. The thermal conductivity (W/mK) was determined from the product of the heat diffusivity and the heat capacity (density×specific heat). It was thus found that the heat-conductive layer 10 had a density of 1.97 g/cm$^3$, and thermal conductivity of 499 W/mK in an in-plane direction and 17.7 W/mK in a thickness direction.

As shown in FIG. 15, one PET film 13a, to which a heat-conductive layer 10a was attached, was laminated with another PET film 13b by a pair of rolls 102a, 102b. The laminated film 1' was cut to individual heat-dissipating films.

Example 2

A heat-conductive layer was formed in the same manner as in Example 1 except for changing the binder resin to low-stereospecific polypropylene, thereby producing a heat-dissipating film. The same measurements as in Example 1 indicate that the heat-conductive layer had a density of 1.98 g/cm$^3$, and thermal conductivity of 516 W/mK in an in-plane direction and 22.9 W/mK in a thickness direction.

Example 3

A dispersion comprising 6% by mass of flaky graphene (H-15 available from XG Sciences, average diameter: 15 μm), 0.06% by mass of polymethylmethacrylate (PMMA), and 93.94% by mass of methyl ethyl ketone was applied to two PET films 12a, 12b as thick as 30 μm, and dried at 40° C. for 2 minutes to form coating layers of flaky graphene and PMMA as thick as 5 g/m$^2$ (expressed by the grams of flaky graphene per 1 m$^2$). This procedure was repeated 15 times in total to form a mixture layer 11a, 11b of flaky graphene and PMMA (containing 75 g/m$^2$ of flaky graphene per 1 m$^2$) on each PET film 12.

As shown in FIG. 6, a pair of PET films 12a, 12b each having a mixture layer 11a, 11b were laminated at 120° C. by a pair of rolls 46a, 46b, with the mixture layers 11a, 11b inside, and then heat-pressed at 150° C. under 20 MPa by plural pairs of heating rolls 47a, 47b, 48a, 48b, to form a laminated film 1' comprising a heat-conductive layer 11 as thick as 100 μm (containing 150 g/m$^2$ of flaky graphene per 1 m$^2$).

After peeling both PET films 12a, 12b from the laminated film 1', each surface of the mixture layer 11 was exposed to a flame (temperature: about 1000° C.) ejected from a gas burner 114 shown in FIG. 8(a), to burn the mixture layer 11. The burnt layer was placed in a cavity 141a of the die 140 shown in FIG. 9, and repeatedly pressed under a load of 7 tons by a pair of rolls 103a, 103b with vibration of 200 Hz, as shown in FIGS. 11(a) and 11(b).

The resultant heat-conductive layer 10 had a density of 1.98 g/cm$^3$, and thermal conductivity of 514 W/mK in an in-plane direction and 5.8 W/mK in a thickness direction.

Effects of the Invention

Because a mixture layer of flaky carbon and a binder resin is densified by heat pressing, burned to carbonize or burn off the binder resin, and then pressed to form a dense heat-conductive layer in the present invention, the heat-conductive layer has high density and thermal conductivity without unevenness in performance. Further, because the dispersion of flaky carbon and a binder resin is applied to a plastic film to form a mixture layer, the production cost can be reduced. Accordingly, the heat-dissipating film of the present invention uniformly has high thermal conductivity. The heat-dissipating film of the present invention having such features is suitable for use in small electronic appliances such as note-type personal computers, smartphones, mobile phones, etc.

DESCRIPTION OF REFERENCE NUMERALS

1: Heat-dissipating film
10: Heat-conductive layer
11, 11a, 11b: Mixture layer
12a, 12b: First plastic film
13a, 13b: Second plastic film
2: Plastic film
3: Dispersion
3a: Dispersion layer
3a': Dried binder resin/flaky carbon layer 3b: Next dispersion layer
31: Flaky carbon
32: Organic solvent
33: Region in which flaky carbon is agglomerated
34: Region free of or scarcely containing flaky carbon
4: Chamber
41a, 41b: Inlet for first plastic film
42a, 42b: Inlet for hot air
43: Gas outlet
45a, 45b: Dispersion-spraying nozzle
46a, 46b: Laminating roll
47a, 47b, 48a, 48b: Heat-pressing roll
49: Guide roll
60, 70a, 70b: Reel
100: Apparatus for producing heat-dissipating film
101a, 101b: A pair of rolls for peeling first plastic film
102a, 102b: A pair of rolls for adhering second plastic film
103a, 103b: A pair of rolls for pressing die

What is claimed is:

1. A method for producing a heat-dissipating film comprising the steps of (1) sandwiching a mixture layer of flaky carbon and a binder resin with a pair of first plastic films to form a laminated film; (2) heat-pressing said laminated film to densify said mixture layer; (3) burning said mixture layer exposed by peeling said first plastic films to carbonize or burn off said binder resin in said mixture layer; (4) pressing the resultant burnt layer to form a densified heat-conductive layer; and (5) sealing said heat-conductive layer with second plastic films.

2. The method for producing a heat-dissipating film according to claim 1, wherein a step of applying a dispersion comprising 5-25% by mass of flaky carbon and 0.05-2.5% by mass of a binder resin in an organic solvent, a mass ratio of said binder resin to said flaky carbon being 0.01-0.1, to a surface of each first plastic film, and then drying said dispersion is repeated plural times, to form said mixture layer.

3. The method for producing a heat-dissipating film according to claim 1, wherein the amount of said dispersion applied by one operation is 5-30 g/m$^2$ expressed by the weight of flaky carbon per 1 m$^2$.

4. The method for producing a heat-dissipating film according to claim 1, wherein said binder resin is an acrylic resin, a polystyrene resin or polyvinyl alcohol.

5. The method for producing a heat-dissipating film according to claim 1, wherein said laminated film is heat-pressed by passing through at least a pair of heating rolls.

6. The method for producing a heat-dissipating film according to claim 5, wherein the heat-pressing temperature is 150-250° C., and the heat-pressing pressure is 20 MPa or more.

7. The method for producing a heat-dissipating film according to claim 1, wherein to carbonize said binder resin in said mixture layer, said mixture layer is burned by exposing both surfaces thereof to a flame, or exposing a die containing said mixture layer to a high temperature of 500° C. or higher.

8. The method for producing a heat-dissipating film according to claim 1, wherein said burnt layer is pressed in a die constraining at least a pair of opposing sides of said burnt layer.

9. The method for producing a heat-dissipating film according to claim 1, wherein said burnt layer is pressed while vibrating a die containing said burnt layer.

10. The method for producing a heat-dissipating film according to claim 1, wherein a lower die part having a cavity and an upper die part having a projection received in said cavity are used; wherein after said burnt layer is put in the cavity of said lower die part, said upper die part is combined with said lower die part such that said projection enters said cavity; and wherein the combined upper and lower die parts are caused to pass through a gap between a pair of pressing rolls plural times, to densify said burnt layer.

11. An apparatus for producing a heat-dissipating film comprising (a) guide rolls for conveying a pair of first plastic films; (b) at least one dispersion-applying nozzle disposed for each first plastic film, such that a dispersion comprising flaky carbon and a binder resin is applied to said first plastic film plural times; (c) a chamber having a hot air inlet for drying each applied dispersion; (d), rolls for laminating a pair of said first plastic films each having the resultant mixture layer comprising said flaky carbon and said binder resin, with the said mixture layer inside; (e) heating rolls for heat-pressing the resultant laminated film; (f) rolls for peeling said first plastic films from said laminated film; (g) a die for burning said mixture layer, such that the exposed binder resin in said mixture layer is carbonized; (h) a pressing die for densifying the resultant burnt layer to form a heat-conductive layer; and (i) rolls for sealing said heat-conductive layer with second plastic films.

12. The apparatus for producing a heat-dissipating film according to claim 11, which comprises pluralities of dispersion-applying nozzles arranged with predetermined intervals along the movement direction of each first plastic film.

13. The apparatus for producing a heat-dissipating film according to claim 11, wherein a pair of dispersion-applying nozzles and laminating rolls are disposed in said chamber; and wherein said chamber comprises first openings through which the first plastic films enter, a pair of hot air inlets disposed near said first openings, a gas outlet, and a second opening through which said laminated film exits.

14. The apparatus for producing a heat-dissipating film according to claim 11, wherein said die for burning said mixture layer is a burner ejecting a flame onto each surface of said mixture layer, or a die containing said mixture layer and exposed to a high temperature of 500° C. or higher.

15. The apparatus for producing a heat-dissipating film according to claim 11, wherein said pressing die for densifying the burnt layer comprises (a) a die comprising a lower die part having a cavity, and an upper die part having a projection engageable with said cavity; (b) a pair of pressing rolls for pressing said die from above and below; and (c) guide plates extending upstream and downstream of a gap of said rolls, such that said die passes through a gap between a pair of said pressing rolls.

* * * * *